United States Patent [19]

Weik

[11] Patent Number: 4,822,641

[45] Date of Patent: Apr. 18, 1989

[54] METHOD OF MANUFACTURING A CONTACT CONSTRUCTION MATERIAL STRUCTURE

[75] Inventor: Günter Weik, Birkenfeld, Fed. Rep. of Germany

[73] Assignee: Inovan GmbH & Co. KG, Birkenfeld, Fed. Rep. of Germany

[21] Appl. No.: 123,957

[22] Filed: Nov. 23, 1987

Related U.S. Application Data

[63] Continuation of Ser. No. 729,060, Apr. 30, 1985, abandoned.

[51] Int. Cl.$^4$ ............................................. C23C 16/06
[52] U.S. Cl. .............................. 427/250; 204/192.15; 204/192.16; 427/125; 427/376.8; 427/405
[58] Field of Search ............ 427/125, 124, 250, 376.8, 427/405, 304, 328; 204/192.15, 192.16, 192.1

[56] References Cited

U.S. PATENT DOCUMENTS

| | | | |
|---|---|---|---|
| 3,028,663 | 4/1962 | Iwersen et al. | 427/125 |
| 3,218,194 | 11/1965 | Maissel | 427/125 |
| 3,917,885 | 11/1975 | Baker | 427/405 |
| 4,309,460 | 1/1982 | Singh et al. | 427/405 |
| 4,309,461 | 1/1982 | Shibata | 427/376.8 |
| 4,475,991 | 10/1984 | Shibata | 427/405 |
| 4,521,257 | 6/1985 | Gevatter et al. | 427/250 |

FOREIGN PATENT DOCUMENTS

| | | | |
|---|---|---|---|
| 2222309 | 1/1973 | Fed. Rep. of Germany | 427/405 |
| 45-17526 | 6/1970 | Japan | 427/405 |
| 51-49133 | 4/1976 | Japan | 427/125 |

OTHER PUBLICATIONS

Wood et al, "The Diffusion of Gold Through Polycrystalline Silver in Thin Films at Temperatures Near 150° C.", Thin Solid Films, vol. 29, 1975, pp. 359–364.

Primary Examiner—Sadie Childs

[57] ABSTRACT

In a method of manufacturing a contact construction material structure a corrosion resistant contact layer of silver, palladium, or alloys thereof is applied to a metal base, a gold coating is applied to the contact layer surface by molecular gold material deposition and the contact construction structure is then heated to 350° to 650° C. for a short period of time to cause diffusion of the gold coating into the corrosion resistant contact layer to further improve its corrosion resistance.

4 Claims, No Drawings

METHOD OF MANUFACTURING A CONTACT CONSTRUCTION MATERIAL STRUCTURE

This is a Continuation application of application Ser. No. 729,060, now abandoned, whose priority of Apr. 30, 1985 is claimed.

BACKGROUND OF THE INVENTION

The invention relates to a method of manufacturing a contact construction structure consisting of a base metal or base metal alloy structure provided with a corrosion resistant contact surface layer of silver or a silver alloy or of palladium or a palladium alloy.

Contact construction structures with contact surface layers of silver or palladium or silver or palladium alloys have the disadvantage that a thin but highly resistant corrosion film is formed on their surfaces quite rapidly which corrosion film results in a relatively high cross-contact current flow resistance. In spite of the otherwise excellent properties of these contact construction materials, other contact construction materials with relatively thick layers of gold as contact surfaces are still widely used. Such heavy application of gold however causes the contact construction material structures to be relatively expensive, and it is therefore the object of the present invention to provide a contact construction material structure which utilizes the advantageous contact materials mentioned above in such a manner that they remain essentially free of undesirable corrosion films.

It is known to apply to contact surfaces gold coatings of about 0.5 to $1.0\mu$ thickness and such coatings will in fact retard the formation of objectionable corrosion films as shown in the article "Diffundierte Goldschichten für schaltende Kontakte" co-authored by the inventor and printed in Edition 1, 1987 of the Magazin METALL, METALL-Verlag GmbH, 1000 Berlin 33, Germany. Corrosion films however will rapidly develop on the untreated surface areas which then will have substantially increased resistivity.

It would, of course, be possible to provide the contact surfaces with a relatively heavy gold coating but this would be quite uneconomical because of the relatively heavy use of goldlike with the contact structures mentioned before. It is also known to provide gold or silver coatings of greater thickness than the $0.5-1\mu$ mentioned before and of smaller thickness than the heavy gold coatings utilized and proven effective with present contact structures, that is, coatings of $5\mu$ to $20\mu$ which consist of gold or silver or alloys thereof. They have been found to be quite suitable and durable for many applications as they prevent the formation of the corrosion films described above and are economically still quite bearable.

It is further known that pure palladium contact members, with which this problem, though somewhat less pronounced, also occurs, can be plated mechanically with a thick gold cladding (German OS 31 43549) which cladding is rolled onto the contact members in several steps so as to achieve the desired dimensions. Intermittently, the contact structures are exposed for short periods of time to temperatures of about 760° C. As a result of such temperature treatment the gold diffuses into the base palladium such that a corrosion inhibiting metal alloy layer is formed which has a gold content that decreases with distance from the surface. The manufacture of such corrosion resistant contact members however is also quite involved because of the step of plating the contact members with a gold layer.

SUMMARY OF THE INVENTION

In order to facilitate automatic manufacturing in accordance with the present invention and to provide for relatively inexpensive but highly corrosion resistant contact structures a method of manufacturing a contact construction structure with a corrosion resistant contact layer of silver, palladium or alloys thereof especially contact construction strips is provided wherein such silver and/or palladium layers are first applied to a metal base and a gold coating is then applied to the contact layer surface by a molecular deposition procedure which layer is finally caused to diffuse into the corrosion resistant contact layer by exposing the contact structure for a short period of time to temperatures of 350° to 650° C. which further improves the corrosion resistance of the contact surface of the contact construction structure. It is pointed out that as a result of the molecular deposition procedure the diffusion coefficient is substantially higher than with plated layer coatings; it is in fact higher by a factor of 1000 to 10,000 permitting the short heating periods for diffusion.

The application of gold to the contact surface areas may be performed galvanically, by sputtering or by chemical vapor deposition. The thickness of the gold coating may be selected to be between $0.1\mu$ and $1\mu$, that is, it may be so thin that the consumption of gold is relatively small and the gold coating is economically justifiable.

It has actually been found that, with the method according to the invention, a mixed-metal layer is formed in the contact surface area by diffusion of the gold on the surface into the base metal which is silver or palladium or one of their alloys. It can be assumed that the gold coating process when performed in accordance with the method according to the invention provides for displacement of any foreign molecules so that no such molecules remain between the gold coating and the contact construction material beneath. The short time, high temperature heating of the contact structures causes diffusion of the gold into the contact material of silver or palladium. It is to be noted that the heating is the last processing step, that is, that high temperature heating takes place only once and diffusion depth of the gold may be defined in a more accurate manner. It is also noted that the coating process utilized in connection with the present invention provides for more even coatings than have been achieved with the plating processes presently in use.

It is noted that contact structures manufactured in accordance with the invention and corrosion-tested by placement over a period of time into a hot, humid environment showed similar to or only slightly less advantageous contact resistance values than contact structures with heavy gold or silver platings which are far less economical.

Finally, it is noted that the method according to the invention may not only be used in connection with discrete contact structures but it may be used advantageously in connection with contact profile strips of the type shown in the earlier U.S. Pat. No. 4,642,891 assigned to the assignee of the present invention.

I claim:

1. A method of manufacturing a contact construction material structure comprising the steps of applying to a metal base a corrosion resistant contact layer of at least one metal of the group comprising silver, palladium and alloys thereof, applying by molecular deposition a thin gold coating of 0.1μ to 1.0μ to said corrosion resistant contact layer, and finally heating the contact construction material with the gold coating disposed on its contact layer surface to 350° to 650° C. for a period of 10 to 1000 seconds to cause diffusion of said gold coating into said corrosion resistant contact layer.

2. A method according to claim 1, wherein said gold coating is galvanically applied to said contact layer.

3. A method according to claim 1, wherein said gold coating is applied by sputtering.

4. A method according to claim 1, wherein said gold coating is applied by chemical vapor deposition.

* * * * *